United States Patent [19]

Sher

[11] 4,213,797

[45] * Jul. 22, 1980

[54] RADIANT ENERGY TO ELECTRIC ENERGY CONVERTER

[76] Inventor: Arden Sher, 108 Charles River Landing Rd., Williamsburg, Va. 23185

[*] Notice: The portion of the term of this patent subsequent to Apr. 11, 1995, has been disclaimed.

[21] Appl. No.: 889,514

[22] Filed: Mar. 23, 1978

Related U.S. Application Data

[63] Continuation-in-part of Ser. No. 631,689, Nov. 13, 1975, Pat. No. 4,084,101.

[51] Int. Cl.² ............................................. H01L 31/04
[52] U.S. Cl. ............................. 136/89 SP; 290/1 R; 361/280; 361/282; 310/308; 310/309; 250/211 R; 250/212; 250/336
[58] Field of Search ............ 136/89 R, 89 NB, 89 SP; 250/211 R, 212, 336; 290/1 R; 361/280, 282; 310/308, 309

[56] References Cited

U.S. PATENT DOCUMENTS

| | | | |
|---|---|---|---|
| 2,648,823 | 8/1953 | Kock et al. | 332/4 |
| 2,879,401 | 3/1959 | Chicurel | 250/83.3 |
| 2,985,757 | 5/1961 | Jacobs et al. | 250/83.3 |
| 3,073,974 | 1/1965 | Hoh | 307/149 |
| 3,170,817 | 2/1965 | Mrgodich | 136/4 |
| 3,210,607 | 10/1965 | Flanagan | 317/40 |
| 3,243,687 | 3/1966 | Hoh | 322/2 |
| 3,333,140 | 7/1967 | Chapman | 313/346 |
| 3,453,432 | 7/1969 | McHenry | 250/83.3 |
| 3,480,777 | 11/1969 | Astheimer | 250/83.3 |
| 3,610,970 | 10/1971 | Skinner | 310/10 |
| 3,657,644 | 4/1972 | Beam et al. | 324/61 R |
| 3,733,499 | 5/1973 | Deis et al. | 310/4 |
| 3,773,564 | 11/1973 | Yamaka et al. | 136/213 |
| 3,971,938 | 7/1976 | O'Hare | 250/336 |
| 4,084,101 | 4/1978 | Sher | 290/1 R |
| 4,096,393 | 6/1978 | Sher | 290/1 R |

OTHER PUBLICATIONS

R. Solomon et al., "Polarization in LaF3", *J. Appl. Phys.*, vol. 37, pp. 3427–3432, (1966).

A. Sher et al., "Transport Properties of LaF3", *Phys. Rev.*, vol. 144, pp. 593–604, (1966).

J. E. Drummond, "Electrical Power Conversion", *IECEC Record '75*, pp. 569–575.

S. B. Skinner, "Thermodielectric Energy Conversion by Thin Films: Experiment & Theory", *Intersociety Energy Conv. Eng. Conf.*, (1967), pp. 865–873.

A. Sher et al., "LaF3 Infrared Detector", *Appl. Phys. Lett.*, vol. 28, pp. 676–678, (1976).

*Primary Examiner*—Aaron Weisstuch
*Attorney, Agent, or Firm*—Lowe, King, Price and Becker

[57] ABSTRACT

Radiant energy is converted into electric energy by irradiating a capacitor including an ionic dielectric. The dielectric is a sintered crystal superionic conductor, e.g., lanthanum trifluoride, lanthanum trichloride, or silver bromide, so that a multiplicity of crystallites exist between electrodes of the capacitor. The radiant energy cyclically irradiates the dielectric so that the dielectric exhibits a cyclic photocapacitive like effect. Adjacent crystallites have abutting surfaces that enable the crystallites to effectively form a multiplicity of series capacitor elements between the electrodes. Each of the capacitor elements has a dipole layer only on or near its surface. The capacitor is initially charged to a voltage just below the dielectric breakdown voltage by connecting it across a DC source causing a current to flow through a charging resistor to the dielectric. The device can be utilized as a radiant energy detector or as a solar energy cell.

59 Claims, 5 Drawing Figures

RADIANT ENERGY TO ELECTRIC ENERGY CONVERTER

ORIGIN OF THE INVENTION

The invention described herein was made in the performance of work under NASA Contract Number NSG 1385 and is subject to the provisions of Section 305 of the National Aeronautics and Space Act of 1958 (72 Stat. 435; 42 U.S.C. 2457).

RELATION TO CO-PENDING APPLICATION

The present invention is a continuation-in-part of my co-pending application entitled "Apparatus for Converting Radiant Energy to Electric Energy", Ser. No. 631,689, filed Nov. 13, 1975, now U.S. Pat. No. 4,084,101 which was issued Apr. 11, 1978.

FIELD OF THE INVENTION

The present invention relates generally to converting radiant energy into electric energy and more particularly to a conversion apparatus and method including an ionic dielectric having a dipole layer only on or near a surface of the dielectric.

BACKGROUND OF THE INVENTION

In the aforementioned co-pending application, a conversion apparatus and method is disclosed wherein radiant energy is converted into electric energy with a pyroelectric device including an ionic dielectric of the type having a dipole layer only on or near its surface in proximity to an electrode. In the prior art device, the dielectric is a single crystal formed from the group consisting of the rare earth trifluorides and trichlorides; lanthanum trifluoride is the preferred compound forming the dielectric. Being pyroelectric, the single crystal devices of the prior art are heated by the impinging radiant energy, without undergoing any Curie point phase transition. In response to the dielectric being heated, the capacitance and resistance of the dielectric are varied. Preferably, the dielectric is periodically irradiated, resulting in cyclic variations of the dielectric capacitance and resistance. It was originally thought that the class of materials utilized in the prior art device would function only by heating from the radiant energy.

BRIEF DESCRIPTION OF THE INVENTION

I have now discovered that the so-called superionic conductor dielectrics, including the class of materials described in my prior application, can under certain circumstances, exhibit photocapacitive-like, as well as pyroelectric, properties in response to irradiation by radiant energy. The photocapacitive-like effect occurs in these materials either in their single crystal form or when they are sintered to form a multiplicity of crystallites between electrodes of the capacitors. In the sintered material, adjacent crystallites have abutting surfaces that enable the crystallites to effectively form a multiplicity of series capacitor elements between the electrodes. Each of these capacitor elements has a dipole layer only on or near its surface. Contact points between the dipole layers of adjacent, abutting crystallites act similarly to blocking, or partially blocking, contacts to enable each crystallite to behave as a separate capacitor.

While the mechanism involved in the photocapacitive-like effect is not evident, it is possible that one of three, or a combination of the three, mechanisms occurs. One of the hypothesized mechanisms for the photocapacitive effect is that electron energy trapping states are excited by the radiant energy at the surfaces of the crystallites that are irradiated by the radiant energy. A second candidate for the proper mechanism is that a photochemical reaction occurs near the surfaces of the crystallites irradiated by the radiant energy. A third possible mechanism is that free electrons are injected into the dielectric from an electrode-dielectric interface that is irradiated by the radiant energy. In any event, it appears evident that the mechanism does not involve creating electron-hole pairs across a band gap of the dielectric material because lanthanum trifluoride sintered crystal capacitors have had peak spectral responses to radiation of 6500 Å, a wavelength much longer than the 1200 Å wavelength associated with the lanthanum trifluoride bandgap.

The multiple crystallite photocapacitive energy converters which I have recently discovered have the same advantages over the older pyroelectric capacitive devices as the single crystal pyroelectric devices disclosed in the co-pending application. In particular, detectors with high signal to noise ratios can be formed of capacitors employing the multicrystallite dielectrics because the dielectrics are not strongly piezoelectric, and therefore are not sensitive to vibrations. In addition, the recently discovered radiant energy converters have efficiency (for energy converter applications) and detectivity (for detector applications) advantages over the single crystal converters disclosed in the co-pending application.

The efficiency of the recently discovered converter is greater than the device disclosed in the co-pending application because the multiple crystals have a higher breakdown voltage than the single crystal structure; the breakdown voltage is increased from a range of approximately 3 to 10 volts for single crystal lanthanum trifluoride to approximately 50 to 100 volts for sintered, multiple crystal lanthanum trifluoride. The increase in breakdown voltage enables the photocapacitive-like device to be charged initially to a higher voltage, so that it is able to store and supply a greater amount of energy to a load. This is so because the energy stored by the capacitor is $$\tfrac{1}{2}CV^2,$$

where:

C is the capacitance of the capacitor, and

V is the voltage applied across the capacitor. While the capacitance of the photocapacitive-like device is less than that of the single crystal device, resulting in a decrease in the value of C, this decreased value of C is more than offset by $V^2$. Hence, the multicrystallite device is ideally suited for solar cell, energy converting applications.

The photocapacitive, multicrystallite detector has an enhanced detectivity for infrared or visible light relative to that of the single crystal device disclosed in the co-pending application. The enhancement occurs because detectivity of a capacitive type detector is a direct function of the voltage initially applied across the capacitor electrodes; detectivity is independent of the capacitance of the capacitor. The material used in the multicrystallite capacitor is also much less expensive than that of the single crystal capacitor.

In accordance with another aspect of the invention, there is provided a new and improved capacitive type solar energy converter circuit that does not rely upon resonant circuit principles, as disclosed in the co-pending application. In the new circuit, the radiant energy responsive, variable capacitor is connected to a DC supply through a relatively high impedance resistor. In shunt with the radiation responsive capacitor is a series circuit including a load capacitor and a resistive load. Because the resistor in series with the DC supply has a high impedance in comparison to the load resistance, practically no current is drawn from the supply once the capacitor has been initially charged, i.e., virtually no current is drawn from the DC supply while the capacitor is being periodically irradiated to develop an AC current. This circuit has the advantage of not requiring a very large inductor for resonating the radiation responsive capacitor.

It is, accordingly, an object of the present invention to provide a new and improved radiant energy to electric energy converter.

Another object of the invention is to provide a new and improved photocapacitive device for converting radiant energy into electric energy.

An additional object of the invention is to provide a new and improved capacitive type radiant energy detector having a relatively high signal to noise ratio.

A further object of the invention is to provide a relatively inexpensive, efficient capacitive device for converting radiant energy into electric energy.

Another object of the invention is to provide a capacitive device for converting radiant energy into electric energy with a device that can have a relatively high voltage initially applied to it.

Another object of the invention is to provide a new and improved circuit for a capacitive type of solar energy converter.

The above and still further objects, features and advantages of the present invention will become apparent upon consideration of the following detailed description of one specific embodiment thereof, especially when taken in conjunction with the accompanying drawing.

DETAILED DESCRIPTION OF THE INVENTION

Figure 1:
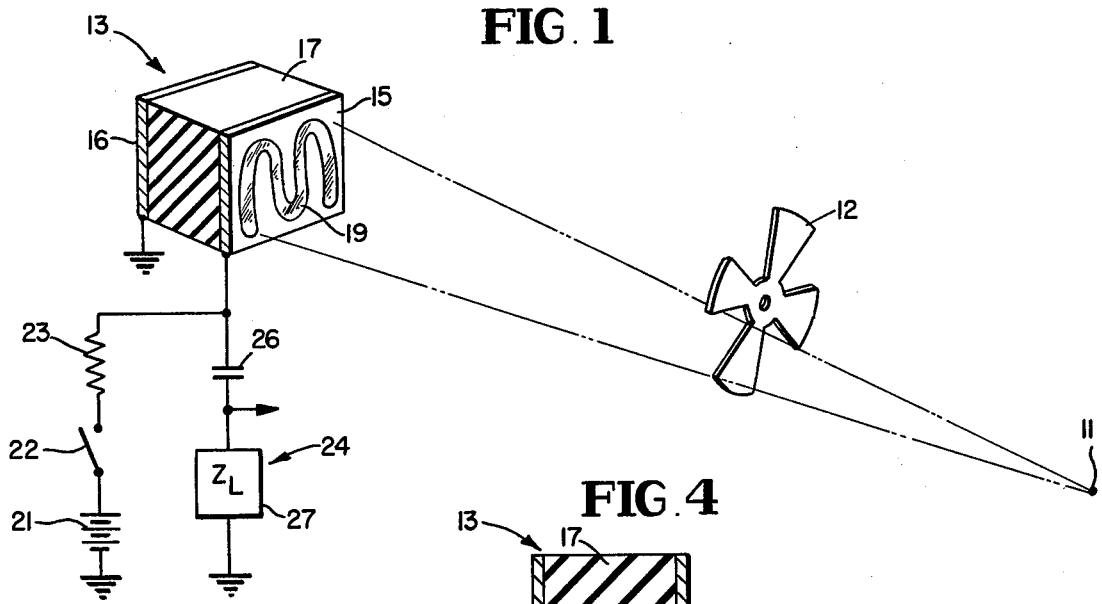
FIG. 1 is a schematic diagram of a detector including a multicrystallite capacitor of a sintered superionic inconductor.

Reference is now made to FIG. 1 of the drawing wherein radiant energy from a suitable source 11 is cyclically interrupted by chopper 12 so that the energy periodically illuminates radiation responsive, variable capacitor 13, that functions similar to a photocapacitor, and is at room temperature. Typically, source 11 is an infrared or visible light source that periodically illuminates a dielectric of capacitor 13 at a frequency determined by the constant rotational velocity of chopper 12.

Detector 13 includes a pair of metal electrodes 15 and 16, between which is sandwiched a sintered, multicrystallite dielectric 17 formed of a superionic conductor. (The term "superionic conductor" refers to dielectrics having resistivities of less than $10^7$ ohm.cm at approximately room temperature. Superionic conductors are discussed in detail in the publications "Conference on Superionic Conductors, Chemistry, Physics and Applications," G.E. Research & Development Center, 1976, published by Plimm, New York, and "Advanced Study Institute on Fast Ion Transport in Solids, Solid State Batteries & Devices," Belgirate, Italy, Sept. 1972, published by American Elsevier, New York, 1973.) Exemplary of superionic conductors are compounds from the group consisting of rare earth trichlorides and trifluorides; lanthanum trifluoride ($LaF_3$) has been found to be quite acceptable as the sintered dielectric 17. It is to be understood, however, that other sintered rare earths can replace lanthanum trifluoride; these rare earths extend from atomic number 58 to atomic number 64 and include cerium, praseodymium, neodymium, samarium, europium and gadolinium (lanthanum has an atomic number of 57). The superionic conductor silver bromide has also been found to possess the desired photocapacitive properties as a single crystal and is expected to have them in a sintered, multicrystallite form.

Slabs of sintered dielectric 17 suitable for capacitor 13 are formed using known techniques from powder-like particles of the superionic conductor that are placed in a mold and heated to a sintered condition in an inert atmosphere that does not include the halogen. Powder-like particles of the compounds $CeF_3$, $GdF_3$, $LaF_3$, $NdF_3$, and $SmF_3$ are available from Materials Research Corporation, Orangeburg, N.Y. Heating causes some of the halogen atoms to vacate their usual position in the crystal, whereby the sintered crystal is extrinsic and not stoichiometric.

Figure 2:
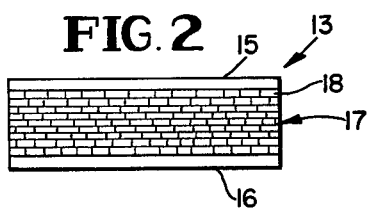
FIG. 2 is a schematic drawing particularly showing the multicrystallite dielectric of the capacitor illustrated in FIG. 1.

The sintered particles form a multiplicity of crystallites, each of which effectively forms a separate capacitor element 18, FIG. 2. The multiple capacitor elements 18 are effectively connected in series between electrodes 15 and 16. Each of the crystallites 18 has a dipole layer only on or near its surface; generally the dipole layer extends into the crystallite to a depth on the order of 1 to 2 microns. Contact points between adjacent, abutting crystallites act the same as blocking contacts or partially blocking contacts.

Because of the multiple series capacitor elements formed by crystallites 18 between electrodes 15 and 16, the total capacitance of capacitor 13 is reduced relative to that of a single crystal capacitor of the same material and geometry. However, the sintered, multiple crystal capacitor 13 has a higher breakdown voltage than the breakdown voltage of a single crystal capacitor fabricated of the same material, having a relatively thin dipole layer on its surface, because of the multiple, series blocking layers of the adjacent crystallites 18 between electrodes 15 and 16. Because of the higher breakdown voltage of the multiple crystallites between electrodes 15 and 16, relative to the voltage of the single crystal structure, a greater initial voltage can be impressed between electrodes 15 and 16, to enhance solar energy efficiency and detector detectivity.

To enable radiant energy from source 11 to impinge directly on dielectric 17, a transparent window 19 is provided on metal electrode 15 that faces the radiant energy source. Window 19 is preferably filled with a dielectric, insulating material that is transparent to radiation from source 11 and which protects dielectric 17; such a material can be, for example, silicon dioxide.

In response to the periodic illumination of dielectric 17 by the chopped radiation from source 11, there is a corresponding periodic modulation of the capacitance of capacitor 13. The capacitance modulation of capacitor 13 appears to be in response to a photocapacitive mechanism of uncertain type. It is evident that the photocapacitive mechanism does not involve electron-hole pairs across a bandgap of sintered dielectric 17 because lanthanum fluoride sintered crystal capacitors that have been actually tested have been found to have peak spectral responses to radiation of 6500 Å, a wavelength much longer than the 1200 Å wavelength associated with the lanthanum fluoride bandgap. One possible mechanism for the photocapacitive effect of capacitor 13 is that electron energy trapping states are excited by the radiation from source 11 at the surfaces of crystallites 18 that are irradiated by the energy. Another possibility for the mechanism is that a photochemical reaction occurs near the surfaces of crystallites 18 that are irradiated by energy by source 11. A third possible mechanism is that free electrons are ejected by the metal of electrode 15 into dielectric 17 from an interface between the electrode and the dielectric.

In one device that has been actually fabricated, a silver paint was painted, to a thickness of between 0.1 to 0.5 microns, to form electrodes 15 and 16 on opposite faces of a slab of sintered lanthanum fluoride dielectric having a thickness of approximately 100 microns. However, the dielectric and electrode thicknesses can be any suitable dimensions; generally the thickness of dielectric 17 is in the range of from 5 to 100 microns.

Prior to the photocapacitive cell 13 being put into operation, a charge is established across dielectric 17 between electrodes 15 and 16. To this end, electrode 15 is initially connected to DC source 21 through switch 22 and current limiting resistor 23. The circuit is completed by connecting one electrode of source 21 and electrode 16 to ground. The voltage of source 21 is selected so that there is no breakdown of dielectric 17 when the voltage is applied between electrodes 15 and 16. The voltage of source 21 can be in the range of 50–100 volts for the multicrystallite, photocapacitive capacitor 13, a potential considerably greater than the 3–10 volt range for the prior art, single crystal capacitor. It is desirable to provide as high an initial voltage as possible between electrodes 15 and 16, without achieving breakdown, so that a substantial current can be derived from detector 13 in response to the periodic irradiation of dielectric 17 by the chopped radiation from source 11.

After the initial voltage has been applied across dielectric 17 by DC source 21, switch 22 is opened and current is supplied by capacitor 13 to an external load circuit in response to the alternate irradiation of the dielectric, which causes modulation of the capacitance of capacitor 13. Switch 22 is opened to prevent noise generated by DC source 21 from being coupled to capacitor 13 while the device is in operation. This is particularly important to minimize noise and enhance signal to noise ratio when capacitor 13 is employed as an infrared or visible light detector. To prevent discharge of capacitor 13, load circuit 24 includes a relatively large blocking capacitor 26, connected in series between electrode 16 and resistive load impedance 27. For detector applications, load 27 has a relatively large, resistive value so that a large voltage can be developed across it and applied to input terminals of an AC amplifier (not shown) that drives a synchronous detector (not shown) responsive to the frequency of the chopped radiation from source 11.

Figure 3:
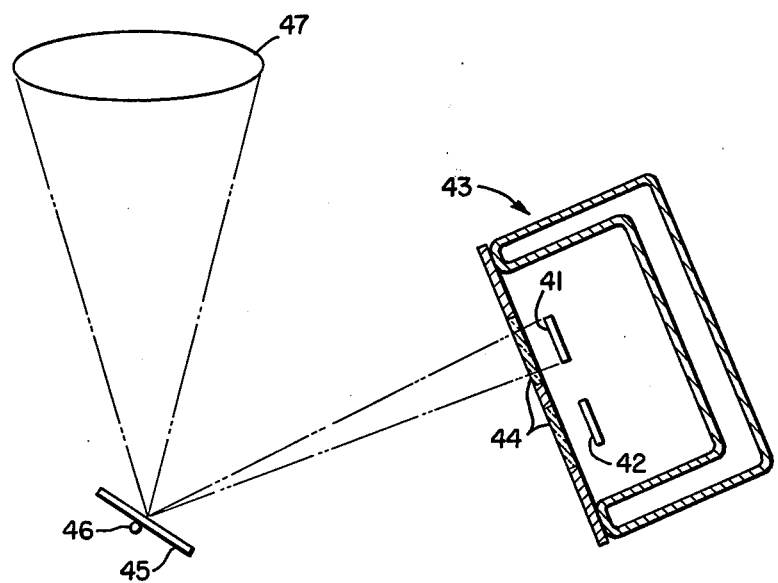
FIG. 3 is a schematic diagram of a photocapacitive solar energy converter in accordance with the invention.

One preferred configuration for a solar cell converter is illustrated in FIG. 3, wherein solar energy irradiates an array including a pair of photocapacitive cells 41 and 42, of the type disclosed supra, so that the cells are alternately irradiated and not irradiated at phases displaced from each other at 180°. To achieve the alternate illumination of cells 41 and 42, the cells are mounted in side-by-side position in a suitable container 43. Cells 41 and 42 are illuminated at phases displaced by 180° through windows 44 by solar energy reflected from oscillating mirror 45 that periodically wobbles, at a predetermined frequency, about pivot point 46 in response to being driven by a motor (not shown). Mirror 45 is positioned to be responsive to solar radiation focused on it by collecting lens 47, in turn positioned to be responsive to solar radiation. In response to the alternate irradiation of cells 41 and 42 by the solar energy reflected by mirror 45, the capacitances of capacitors 41 and 42 are correspondingly modulated to deliver power to a pair of load circuits, one of which is provided for each of the capacitors. Power derived from the load circuits can be summed together, utilizing conventional transformer circuitry or the like.

Sintered crystal, superionic conductor capacitors 41 and 42 are preferred over other materials as the dielectric for capacitors 41 and 42 because they have a relatively high gain parameter, which enables them efficiently to convert solar energy to electric energy. This is no change in state of the superionic conductor dielectrics from ferroelectric to non-ferroelectric in response to the solar radiation. Because no change in state occurs, capacitors 41 and 42 have no tendency to crack, even if they are cyclically heated and cooled by the solar radiation. The alternate illumination of capacitors 41 and 42 results in enhanced solar energy converter efficiency because the modulation process for the capacitors does not cause one-half of the solar energy from the solar energy to be blocked from capacitors 41 and 42.

Figure 4:
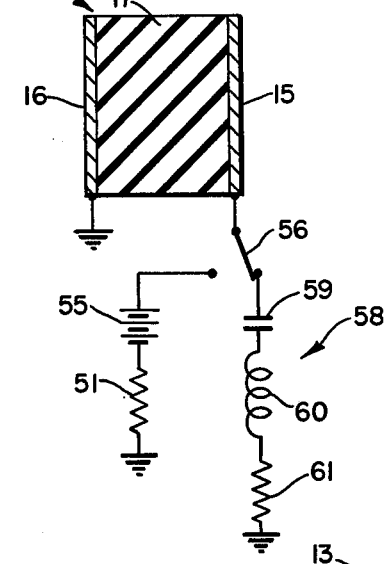
FIGS. 4 and 5 are circuit diagrams of solar energy, capacitive converters in accordance with the invention.

One preferred configuration for efficiently transferring energy from capacitors 41 and 42 to a load is illustrated in FIG. 4. In FIG. 4, a single cell 13 is connected to a matched load 61 through a resonant circuit including inductor 60. The value of inductor 60 is selected to series resonant capacitor 13 at the frequency of the chopped solar radiation, or a harmonic thereof. Capacitor 13 is initially charged to the voltage of DC power supply 55 through double pole, single throw switch 56 and current limiting resistor 51. The voltage of source 55 is selected to be as high as possible, without achieving breakdown of dielectric 17.

After a charge has been applied by source 55 to capacitor 13, switch 56 is activated to disconnect source 55 from the capacitor and to connect load circuit 58 in series with the capacitor. Load circuit 58 includes a DC blocking capacitor 59 that prevents the charge on capacitor 13 from discharging into the remainder of the load circuit, which includes resonant inductance 60 and resistive load impedance 61. Blocking capacitor 59 has a value much larger than the static capacitance of capacitor 13. To achieve resonance, the value of inductance 60 is selected in accordance with:

$$L = C_O - C_L/\omega^2 C_O C_L$$

which is approximately equal to $$1/\omega^2 C_O$$

where:
$\omega = 2\pi f$,
f = the oscillation frequency of mirror 45,
$C_L$ = the capacitance of blocking capacitor 59, and
$C_O$ = the static capacitance of capacitor 13, i.e., the capacitance of capacitor 13 when it is not illuminated.

Figure 5:
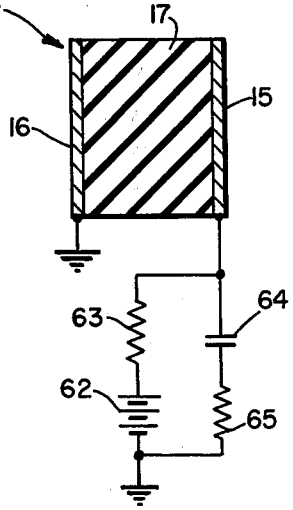

Another circuit for energizing capacitor 13, for solar cell energy converting applications, is schematically illustrated in FIG. 5. In the circuit of FIG. 5, a DC voltage is maintained across electrodes 15 and 16 of capacitor 13 by a DC source 62, which is connected to electrode 15 through relatively large resistor 63. Resistor 63 is connected permanently to electrode 15, rather than being connected to the electrode through a switch. This is possible because the noise of the DC source is not important for solar cell applications, and because the value of resistor 63 is sufficiently large to prevent any substantial current from flowing between source 62 and the remainder of the circuit. Connected in shunt with source 62 and resistor 63 is a load circuit including the series combination of blocking capacitor 64 and load resistor 65. The impedance of blocking capacitor 64 is large relative to the static impedance of capacitor 13, while the resistance of resistor 65 is considerably less than that of resistor 63. The circuit of FIG. 5 is advantageous relative to the circuit of FIG. 4 because the former does not require a large value inductor to resonate capacitor 13.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. Apparatus for converting radiant energy into electric energy comprising a capacitor including an ionic dielectric and a pair of electrodes, means for causing said dielectric to be cyclically irradiated by said radiant energy, the properties of said dielectric being dominated by a dipole layer only on or near its surface, the capacitance of the capacitor being modulated in response to the cyclic irradiation, and means for connecting a load to the electrodes so the load is responsive to current derived from the capacitor in response to the capacitance modulation.

2. The apparatus of claim 1 further including means for initially charging the capacitor to a voltage sufficient to cause a current to flow in the load, said voltage being less than the breakdown voltage of the capacitor dielectric.

3. The apparatus of claim 1 wherein the dielectric includes a multiplicity of crystallites between the electrodes, adjacent ones of said crystallites having abutting surfaces that enable the crystallites to effectively form a multiplicity of series capacitor elements between the electrodes, each of said capacitor elements having a dipole layer only on or near its surface.

4. The apparatus of claim 3 further including means for initially charging the capacitor to a voltage sufficient to cause a current to flow in the load, said voltage being less than the breakdown voltage of the capacitor dielectric.

5. The apparatus of claim 1 wherein one of the electrodes includes window means for the radiant energy, the radiant energy irradiating the dielectric through the window means.

6. Apparatus for converting radiant energy into electric energy comprising a capacitor including an ionic dielectric and a pair of electrodes, means for causing said dielectric to be cyclically irradiated by said radiant energy, said dielectric being selected from the group consisting of the superionic conductors, the capacitance of the capacitor being modulated in response to the cyclic irradiation, and means for connecting a load to the electrodes so the load is responsive to current derived from the capacitor in response to the capacitance modulation.

7. The apparatus of claim 6 wherein the dielectric is selected from the group consisting of the rare earth trifluorides and trichlorides.

8. The apparatus of claim 7 further including means for initially charging the capacitor to a voltage sufficient to cause a current to flow in the load, said voltage being less than the breakdown voltage of the capacitor dielectric.

9. The apparatus of claim 6 wherein the dielectric is a sintered rare earth trifluoride or trichloride.

10. The apparatus of claim 9 wherein the dielectric is sintered crystal lanthanum trifluoride.

11. The apparatus of claim 9 further including means for initially charging the capacitor to a voltage sufficient to cause a current to flow in the load, said voltage being less than the breakdown voltage of the capacitor dielectric.

12. The apparatus of claim 6 wherein one of the electrodes includes window means for the radiant energy, the radiant energy irradiating the dielectric through the window means.

13. The apparatus of claim 6 wherein the dielectric is sintered silver bromide.

14. Apparatus for converting radiant energy into electric energy comprising a capacitor including an ionic dielectric and a pair of electrodes, means for causing said dielectric to be irradiated by the radiant energy, the properties of said dielectric being dominated by a dipole layer only on or near its surface, the capacitance of the capacitor being modulated in response to the irradiation, and means for connecting a load to the electrodes so the load is responsive to current derived from the capacitor in response to the capacitance modulation.

15. The apparatus of claim 14 further including means for initially charging the capacitor to a voltage sufficient to cause a current to flow in the load, said voltage being less than the breakdown voltage of the capacitor dielectric.

16. The apparatus of claim 14 wherein the dielectric includes a multiplicity of crystallites between the electrodes, adjacent ones of said crystallites having abutting surfaces that enable the crystallites to effectively form a multiplicity of series capacitor elements between the electrodes, each of said capacitor elements having a dipole layer only on or near its surface.

17. The apparatus of claim 16 further including means for initially charging the capacitor to a voltage sufficient to cause a current to flow in the load, said voltage being less than the breakdown voltage of the capacitor dielectric.

18. Apparatus for converting radiant energy into electric energy comprising a capacitor including an ionic dielectric and a pair of electrodes, means for causing the dielectric to be irradiated by the radiant energy, said dielectric being selected from the group consisting of the superionic conductors, the capacitance of the capacitor being modulated in response to the irradiation, means for connecting a load to the electrodes so the load is responsive to current derived from the capacitor in response to the capacitance modulation.

19. The apparatus of claim 18 further including means for initially charging the capacitor to a voltage sufficient to cause a current to flow in the load, said voltage being less than the breakdown voltage of the capacitor dielectric.

20. The apparatus of claim 19 wherein the dielectric is selected from the group consisting of the rare earth trifluorides and trichlorides.

21. The apparatus of claim 20 further including means for initially charging the capacitor to a voltage sufficient to cause a current to flow in the load, said voltage being less than the breakdown voltage of the capacitor dielectric.

22. The apparatus of claim 19 wherein one of the electrodes includes window means for the radiant energy, the radiant energy irradiating the dielectric through the window means.

23. The apparatus of claim 19 wherein the dielectric is sintered silver bromide.

24. The apparatus of claim 19 wherein the dielectric is a sintered rare earth trifluoride or trichloride.

25. The apparatus of claim 24 wherein the dielectric is sintered crystal lanthanum trifluoride.

26. The apparatus of claim 24 further including means for initially charging the capacitor to a voltage sufficient to cause a current to flow in the load, said voltage being less than the breakdown voltage of the capacitor dielectric.

27. A method of converting radiant energy into electric energy comprising illuminating a capacitor having electrodes and an ionic dielectric with a source of the radiant energy, the properties of said dielectric being dominated by a dipole layer only on or near its surface, the capacitance of the capacitor thereof being modulated in response to the illuminating radiant energy, and connecting a load to the electrodes so the load is responsive to current derived from the capacitor in response to the capacitance modulation.

28. The method of claim 27 wherein the capacitor is cyclically irradiated by the radiant energy.

29. The method of claim 27 wherein the dielectric includes a multiplicity of crystallites between the electrodes, adjacent ones of said crystallites having abutting surfaces that enable the crystallites to effectively form a multiplicity of series capacitor elements between the electrodes, each of said capacitor elements having a dipole layer only on or near its surface.

30. The method of claim 29 further including initially charging the capacitor to a voltage sufficient to cause a current to flow in the load, said voltage being less than the breakdown voltage of the capacitor dielectric.

31. The method of claim 27 further including initially charging the capacitor to a voltage sufficient to cause a current to flow in the load, said voltage being less than the breakdown voltage of the capacitor dielectric.

32. A method of converting radiant energy into electric energy comprising illuminating a capacitor having electrodes and an ionic dielectric with a source of radiant energy, said dielectric being selected from the group consisting of the superionic conductors, the capacitance of the capacitor being modulated in response to the irradiation, and connecting a load to the electrodes so the load is responsive to current derived from the capacitor in response to the capacitance modulation.

33. The method of claim 32 wherein the capacitor is cyclically irradiated by the radiant energy.

34. The method of claim 32 wherein the dielectric is selected from the group consisting of the rare earth trifluorides and trichlorides.

35. The method of claim 34 further including initially charging the capacitor to a voltage sufficient to cause a current to flow in the load, said voltage being less than the breakdown voltage of the capacitor dielectric.

36. The method of claim 34 wherein the dielectric is a sintered rare earth trifluoride or trichloride.

37. The method of claim 32 wherein the dielectric is a sintered crystal lanthanum trifluoride.

38. The method of claim 32 further including initially charging the capacitor to a voltage sufficient to cause a current to flow in the load, said voltage being less than the breakdown voltage of the capacitor dielectric.

39. Apparatus for converting radiant energy into electric energy comprising a capacitor including an ionic dielectric and a pair of electrodes, means for causing said dielectric to be cyclically irradiated by said radiant energy, the properties of said dielectric being dominated by a dipole layer only on or near its surface, the dielectric exhibiting a photocapacitive effect and being modulated in response to the cyclic irradiation, and means for connecting a load to the electrodes so the load is responsive to current derived from the capacitor in response to the dielectric modulation.

40. Apparatus for converting radiant energy into electric energy comprising a capacitor including an ionic dielectric and a pair of electrodes, means for causing said dielectric to be cyclically irradiated by said radiant energy, the properties of said dielectric being dominated by a dipole layer only on or near its surface, the dielectric exhibiting a capacitive effect in response to excitation of trapping electron energy states by the radiant energy at the surface of the dielectric irradiated by the radiant energy and being modulated in response to the cyclic irradiation, and means for connecting a load to the electrodes so the load is responsive to current derived from the capacitor in response to the dielectric modulation.

41. Apparatus for converting radiant energy into electric energy comprising a capacitor including an ionic dielectric and a pair of electrodes, means for causing said dielectric to be cyclically irradiated by said radiant energy, the properties of said dielectric being dominated by a dipole layer only on or near its surface, the dielectric exhibiting a photocapacitive effect in response to a photochemical reaction near the surface of the dielectric irradiated by the radiant energy and being modulated in response to the cyclic irradiation, and means for connecting a load to the electrodes so the load is responsive to current derived from the capacitor in response to the dielectric modulation.

42. Apparatus for converting radiant energy into electric energy comprising a capacitor including an ionic dielectric and a pair of electrodes, means for causing said dielectric to be cyclically irradiated by said radiant energy, the properties of said dielectric being dominated by a dipole layer only on or near its surface, the dielectric exhibiting a photocapacitive effect in response to electrons injected into the dielectric from one of said electrodes in response to said electrode being irradiated by the radiant energy and being modulated in response to the cyclic irradiation, and means for connecting a load to the electrodes so the load is responsive to current derived from the capacitor in response to the dielectric modulation.

43. Apparatus for converting radiant energy into electric energy comprising a capacitor including an ionic dielectric and a pair of electrodes, means for causing said dielectric to be cyclically irradiated by said radiant energy, said dielectric being selected from the group consisting of the superionic conductors, the dielectric exhibiting a photocapacitive effect and being modulated in response to the cyclic irradiation, and means for connecting a load to the electrodes so the load is responsive to current derived from the capacitor in response to the dielectric modulation.

44. Apparatus for converting radiant energy into electric energy comprising a capacitor including an ionic dielectric and a pair of electrodes, means for causing said dielectric to be cyclically irradiated by said radiant energy, said dielectric being selected from the group consisting of the superionic conductors, the dielectric exhibiting a photocapacitive effect in response to excitation of trapping electron energy states by the radiant energy at the surface of the dielectric irradiated by the radiant energy and being modulated in response to the cyclic irradiation, and means for connecting a load to the electrodes so the load is responsive to current derived from the capacitor in response to the dielectric modulation.

45. Apparatus for converting radiant energy into electric energy comprising a capacitor including an ionic dielectric and a pair of electrodes, means for causing said dielectric to be cyclically irradiated by said radiant energy, said dielectric being selected from the group consisting of the superionic conductors, the dielectric exhibiting a photocapacitive effect in response to a photochemical reaction near the surface of the dielectric irradiated by the radiant energy and being modulated in response to the cyclic irradiation, and means for connecting a load to the electrodes so the load is responsive to current derived from the capacitor in response to the dielectric modulation.

46. Apparatus for converting radiant energy into electric energy comprising a capacitor including an ionic dielectric and a pair of electrodes, means for causing said dielectric to be irradiated by the radiant energy, the properties of said dielectric being dominated by a dipole layer only on or near its surface, the dielectric exhibiting a photocapacitive effect and being modulated in response to the irradiation, and means for connecting a load to the electrodes so the load is responsive to current derived from the capacitor in response to the dielectric modulation.

47. Apparatus for converting radiant energy into electric energy comprising a capacitor including an ionic dielectric and a pair of electrodes, means for causing said dielectric to be irradiated by the radiant energy, the properties of said dielectric being dominated by a dipole layer only on or near its surface, the dielectric exhibiting a photocapacitive effect in response to excitation of trapping electron energy states by the radiant energy at the surface of the dielectric irradiated by the radiant energy and being modulated in response to the irradiation, and means for connecting a load to the electrodes so the load is responsive to current derived from the capacitor in response to the dielectric modulation.

48. Apparatus for converting radiant energy into electric energy comprising a capacitor including an ionic dielectric and a pair of electrodes, means for causing said dielectric to be irradiated by the radiant energy, the properties of said dielectric being dominated by a dipole layer only on or near its surface, the dielectric exhibiting a photocapacitive effect in response to a photochemical reaction near the surface of the dielectric irradiated by the radiant energy and being modulated in response to the irradiation, and means for connecting a load to the electrodes so the load is responsive to current derived from the capacitor in response to the dielectric modulation.

49. Apparatus for converting radiant energy into electric energy comprising a capacitor including an ionic dielectric and a pair of electrodes, means for causing said dielectric to be irradiated by the radiant energy, the properties of said dielectric being dominated by a dipole layer only on or near its surface, the dielectric exhibiting a photocapacitive effect in response to electrons injected into the dielectric from one of said electrodes in response to said electrode being irradiated by the radiant energy and being modulated in response to the irradiation, and means for connecting a load to the electrodes so the load is responsive to current derived from the capacitor in response to the dielectric modulation.

50. Apparatus for converting radiant energy into electric energy comprising a capacitor including an ionic dielectric and a pair of electrodes, means for causing the dielectric to be irradiated by the radiant energy, said dielectric being selected from the group consisting of the superionic conductors, the dielectric exhibiting a photocapacitive effect and being modulated in response to the irradiation, means for connecting a load to the electrodes so the load is responsive to current derived from the capacitor in response to the dielectric modulation.

51. Apparatus for converting radiant energy into electric energy comprising a capacitor including an ionic dielectric and a pair of electrodes, means for causing the dielectric to be irradiated by the radiant energy, said dielectric being selected from the group consisting of the superionic conductors, the dielectric exhibiting a photocapacitive effect in response to excitation of trapping electron energy states by the radiant energy at the surface of the dielectric irradiated by the radiant energy and being modulated in response to the irradiation, means for connecting a load to the electrodes so the load is responsive to current derived from the capacitor in response to the dielectric modulation.

52. Apparatus for converting radiant energy into electric energy comprising a capacitor including an ionic dielectric and a pair of electrodes, means for causing the dielectric to be irradiated by the radiant energy, said dielectric being selected from the group consisting of the superionic conductors, the dielectric exhibiting a photocapacitive effect in response to a photochemical reaction near the surface of the dielectric irradiated by the radiant energy and being modulated in response to the irradiation, means for connecting a load to the electrodes so the load is responsive to current derived from the capacitor in response to dielectric modulation.

53. In a method of converting radiant energy into electric energy comprising illuminating a capacitor having an ionic dielectric with a source of the radiant energy, the improvement being that the properties of said dielectric are dominated by a dipole layer only on or near its surface, and that the dielectric exhibits a photocapacitive effect and is modulated in response to the illuminating radiant energy.

54. In a method of converting radiant energy into electric energy comprising illuminating a capacitor having an ionic dielectric with a source of the radiant energy, the improvement being that the properties of said dielectric are dominated by a dipole layer only on or near its surface, and that the dielectric exhibits a photocapacitive effect in response to excitation of trapping electron energy states by the radiant energy at the surface of the dielectric irradiated by the radiant energy and is modulated in response to the illuminating radiant energy.

55. In a method of converting radiant energy into electric energy comprising illuminating a capacitor having an ionic dielectric with a source of the radiant energy, the improvement being that the properties of said dielectric are dominated by a dipole layer only on or near its surface, and that the dielectric exhibits a photocapacitive effect in response to a photochemical reaction near the surface of the dielectric irradiated by the radiant energy and is modulated in response to the illuminating radiant energy.

56. In a method of converting radiant energy into electric energy comprising illuminating a capacitor having an ionic dielectric with a source of the radiant energy, the improvement being that the properties of said dielectric are dominated by a dipole layer only on or near its surface, and that the dielectric exhibits a photocapacitive effect in response to electrons injected into the dielectric from an electrode of the capacitor in response to the electrode being irradiated by the radiant energy and is modulated in response to the illuminating radiant energy.

57. In a method of converting radiant energy into electric energy comprising illuminating a capacitor having an ionic dielectric with a source of radiant energy, the improvement being that said dielectric is selected from the group consisting of the superionic conductors, and that the dielectric exhibits a photocapacitive effect and is modulated in response to the irradiation.

58. In a method of converting radiant energy into electric energy comprising illuminating a capacitor having an ionic dielectric with a source of radiant energy, the improvement being that said dielectric is selected from the group consisting of the superionic conductors, and that the dielectric exhibits a photocapacitive effect in response to excitation of trapping electron energy states by the radiant energy at the surface of the dielectric irradiated by the radiant energy and is modulated in response to the irradiation.

59. In a method of converting radiant energy into electric energy comprising illuminating a capacitor having an ionic dielectric with a source of radiant energy, the improvement being that said dielectric is selected from the group consisting of the superionic conductors, and that the dielectric exhibits a photocapacitive effect in response to a photochemical reaction near the surface of the dielectric irradiated by the radiant energy and is modulated in response to the irradiation.

* * * * *